(12) United States Patent
Gaydos et al.

(10) Patent No.: US 10,577,686 B2
(45) Date of Patent: Mar. 3, 2020

(54) CORROSION RESISTANT AND LOW EMBRITTLEMENT ALUMINUM ALLOY COATINGS ON STEEL BY MAGNETRON SPUTTERING

(71) Applicant: THE BOEING COMPANY, Chicago, IL (US)

(72) Inventors: Stephen P. Gaydos, St. Louis, MO (US); Vijaykumar S. Ijeri, Bangalore (IN); Om Prakash, Bangalore (IN); Suman K. Mishra, Jamshedpur (IN); Raghuvir Singh, Jamshedpur (IN); Sharma Paswan, Jamshedpur (IN); Lokesh C. Pathak, Jamshedpur (IN)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/678,757

(22) Filed: Aug. 16, 2017

(65) Prior Publication Data
US 2018/0355470 A1 Dec. 13, 2018

(30) Foreign Application Priority Data
Jun. 9, 2017 (IN) .............................. 201711020234

(51) Int. Cl.
| | |
|---|---|
| *C23C 14/35* | (2006.01) |
| *C23C 14/16* | (2006.01) |
| *C22C 21/10* | (2006.01) |
| *C23C 14/34* | (2006.01) |
| *C22C 21/06* | (2006.01) |
| *C22C 21/16* | (2006.01) |
| *H01J 37/34* | (2006.01) |

(Continued)

(52) U.S. Cl.
CPC ............ *C23C 14/165* (2013.01); *C22C 21/00* (2013.01); *C22C 21/06* (2013.01); *C22C 21/10* (2013.01); *C22C 21/16* (2013.01); *C23C 14/345* (2013.01); *C23C 14/3414* (2013.01); *C23C 14/3485* (2013.01); *C23C 14/35* (2013.01); *C23C 14/352* (2013.01); *H01J 37/3426* (2013.01); *C22F 1/04* (2013.01); *H01J 37/3467* (2013.01); *Y10T 428/12757* (2015.01)

(58) Field of Classification Search
None
See application file for complete search history.

(56) References Cited

U.S. PATENT DOCUMENTS

2005/0196548 A1  9/2005  Goedicke et al.
2016/0326607 A1* 11/2016  Jeong ........................ C22F 1/06

OTHER PUBLICATIONS

European Search Report for Application No. 18176706.2-1103 dated Jan. 3, 2019.

(Continued)

*Primary Examiner* — Daniel J. Schleis
(74) *Attorney, Agent, or Firm* — Patterson + Sheridan, LLP (57) ABSTRACT

The present disclosure provides alloys for coating a steel substrate, the alloys comprising aluminum and one or more of zinc, magnesium, and zirconium. The alloy coatings have a percent total pore volume of about 5% or less and an average pore diameter about 10 microns or less. The present disclosure further provides methods of depositing aluminum alloy onto a substrate, magnetron sputtering targets, and methods for making coated steel.

23 Claims, 7 Drawing Sheets

(51) Int. Cl.
C22C 21/00 (2006.01)
C22F 1/04 (2006.01)

(56) References Cited

OTHER PUBLICATIONS

Peter Spiekermann. "Legierungen—ein besonderes patentrechtliches Problem?," 84. Jg./1993, 13 pages.
L. Li and W. B. Nowak, "Biased magnetron sputter deposition of corrosion resistant Al-Zn alloy thin films," 8257a Journal of Vacuum Science & Technolgy A 12(1994)Jul./Aug., No. 4, Pt.I, Woodbury, NY, US, 8 pages.
Baldwin et al, Aluminium-Magnesium Alloys as Corrosion Resistant Coatings for Steel, Corrosion Science, (1996) vol. 38, No. 1, pp. 155-170.
Enders et al, Ion-beam-assisted Deposition of Aluminium and Aluminium Alloy Coatings for Corrosion Protection, Surface and Coatings Technology, (1995) pp. 959-965.
Griguceviciene et al, Structure and Initial Corrosion Resistance of Sputter Deposited Nanocrystalline Mg-Al-Zr Alloys, Materials Science and Engineering A 394 (2005) pp. 411-416.
Lauwerens et al, PVD Al-Ti and Al-Mn Coatings for High Temperature Corrosion Protection of Sheet Steel, Surface and Coatings Technology 146-147 (2001) pp. 27-32.
Mao et al, Corrosion Properties of Aluminium Coatings Deposited on Sintered NdFeB by Ion-beam-assisted Deposition, Applied Surface Science 257 (2011) pp. 5581-5585.
Perez et al, Influence of Metallurgical States on the Corrosion Behaviour of Al-Zn PVD Coatings in Saline Solution, Corrosion Science 74 (2013) pp. 240-249.
Reffass et al, Corrosion Behaviour of Magnetron-sputtered Al1-x-Mnx coatings in Neutral Saline Solution, Corrosion Science 52 (2010) pp. 3615-3623.
Sanchette et al, Mechanically Reinforced and Corrosion-resistant Sputtered Amorphous Aluminium Alloy Coatings, 98 (1998) pp. 1162-1168.
Shedden et al, Stoichiometry of Unbalanced Magnetron Sputtered Al-Mg Alloy Coatings, 97 (1997) pp. 557-563.
Extended European Search Report for Application No. 18176706.2-1103/3461926 dated Jun. 26, 2019.

* cited by examiner

CORROSION RESISTANT AND LOW EMBRITTLEMENT ALUMINUM ALLOY COATINGS ON STEEL BY MAGNETRON SPUTTERING

CROSS-REFERENCE TO RELATED APPLICATIONS

This application is a U.S. non-provisional patent application that claims the benefit of a co-pending Indian provisional patent application serial no. 201711020234 filed Jun. 9, 2017. The aforementioned related patent application is incorporated herein by reference in its entirety.

FIELD

Aspects of the present disclosure generally relate to aluminum alloy coatings for steel, methods of depositing aluminum alloy onto a substrate, magnetron sputtering targets, and aluminum alloy coated substrates.

BACKGROUND

Steel is used in many industries because it is a high strength material. To improve the qualities of steel, coatings can be disposed on steel. For example, cadmium coated steel is a material used as aircraft components for aerospace and military applications in humid environments. Cadmium coatings are referred to in the industry as a 'sacrificial coating' because cadmium protects steel from the humidity and degrades slowly. Other technologies are being developed to provide other coatings. For example, low hydrogen embrittlement Zinc-Nickel (LHE Zn—Ni) (e.g., AlumiPlate™) coatings offer similar performance to cadmium coated aluminum. Aluminum is another alternative for coatings on aeronautical components. Aluminum coated steel is conventionally made by ion vapor deposition (IVD) of aluminum onto the steel. Alternatively, ionic liquid-based coating formulations have been developed to eliminate aqueous and organic solvents from coating formulations.

Nonetheless, there is a need for protective coatings for steel having reduced porosity as compared to coatings formed by ion vapor deposition and having a broader range of metals to be used in the protective coating, as compared to Zn—Ni plating. There is also a need for protective coatings for steel that can be formed without the use of organic solvents and other non-ideal materials.

SUMMARY

The present disclosure provides an alloy coating for coating a substrate, such as a steel substrate, that includes aluminum and one or more of: about 1 wt % to about 15 wt % zinc based on the total weight of the alloy, about 1 wt % to about 10 wt % magnesium based on the total weight of the alloy, and about 0.1 wt % to about 5 wt % zirconium based on the total weight of the alloy. The alloy coating has a percent total pore volume of about 5% or less and an average pore diameter about 10 microns or less.

In other aspects, a substrate, such as a steel substrate, comprises an aluminum alloy of the present disclosure disposed thereon.

The present disclosure further provides a magnetron sputtering target comprises an aluminum alloy of the present disclosure.

In other aspects, a method of magnetron sputtering an aluminum alloy onto a substrate includes flowing a sputter gas to a processing region of a process chamber, the process chamber having an aluminum alloy sputter target comprising one or more of about 1 wt % to about 15 wt % zinc based on the total weight of the alloy, about 1 wt % to about 10 wt % magnesium based on the total weight of the alloy, and about 0.1 wt % to about 5 wt % zirconium based on the total weight of the alloy. The alloy coating has a percent total pore volume of about 5% or less and an average pore diameter about 10 microns or less. The method includes delivering an energy pulse to the sputter gas and depositing the aluminum alloy onto a substrate.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only typical aspects of this present disclosure and are therefore not to be considered limiting of its scope, for the present disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure provides alloys for coating a steel substrate, the alloys comprising aluminum and one or more of: about 1 wt % to about 15 wt % zinc based on the total weight of the alloy, about 1 wt % to about 10 wt % magnesium based on the total weight of the alloy, and about 0.1 wt % to about 5 wt % zirconium based on the total weight of the alloy. The alloy coatings have a percent total pore volume of about 5% or less and an average pore diameter about 10 microns or less. Aluminum alloys of the present disclosure can be disposed on a substrate, such as a steel substrate, such as an aircraft component. Aluminum alloys of the present disclosure provide coatings having corrosion resistance according to ASTM B 117 of 500 hours or more.

Figure 1:
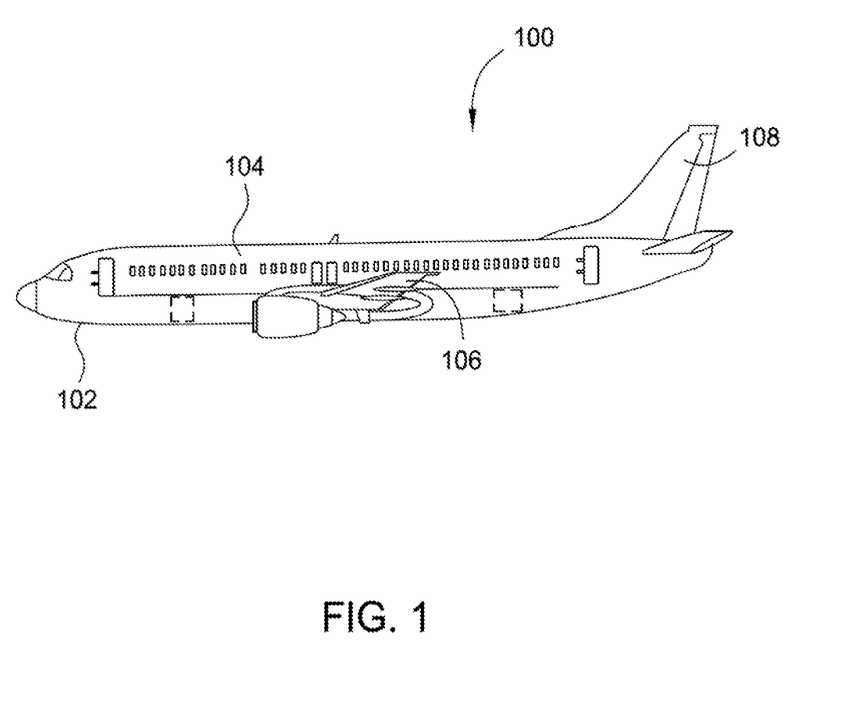
FIG. 1 is an aircraft comprising steel substrates according to an aspect of the present disclosure.

Aluminum alloys of the present disclosure may be disposed on components of aircraft, spacecraft, watercraft, engine and blown-flap, exhaust-washed structures, warm-structure components for high-performance supersonic, hypersonic, and space re-entry vehicle structures, and propulsion structures such as power-generation turbines, vehicle engines, alternative-energy applications, and related technologies. For example, aluminum alloys of the present disclosure may be disposed on steel-based landing gears and/or a bottom surface of an aircraft. FIG. 1 is an aircraft comprising steel structures (e.g., substrates) according to an aspect of the present disclosure. As shown in FIG. 1, aircraft 100 includes an aircraft structure 102 including aircraft components such as an elongated body 104, a wing 106 extending laterally from the body 104, and a tail 108 extending longitudinally from the body 104. Aluminum alloys of the present disclosure may be disposed on one or more surface of these aircraft components to form one or more corrosion resistant aluminum alloy coatings on the aircraft component(s).

Alloys

Aluminum (Al) alloys of the present disclosure include one or more of magnesium (Mg), zinc (Zn), and zirconium (Zr). In at least one aspect, aluminum alloys of the present disclosure include Mg from about 1 wt % to about 10 wt %, such as from about 1 wt % to about 5 wt % based on the total weight of the alloy. In at least one aspect, aluminum alloys of the present disclosure include Zn from about 1 wt % to about 15 wt %, such as from about 5 wt % to about 12 wt %, such as from about 8 wt % to about 10 wt % based on the total weight of the alloy. In at least one aspect, aluminum alloys of the present disclosure include Zr from about 0.1 wt % to about 5 wt %, such as from about 1 wt % to about 3 wt %, for example about 1 wt %, based on the total weight of the alloy. In at least one aspect, an aluminum alloy has 5 wt % Mg and 95 wt % Al (denoted Al—5Mg). Alternatively, an aluminum alloy has 5 wt % Mg, 5 wt % Zn and 90 wt % Al (denoted Al—5Zn—5Mg). In at least one aspect, an aluminum alloy has 9 wt % Zn, 5 wt % Mg, and 86% Al (denoted Al—9Zn—5Mg). Alternatively, an aluminum alloy has 9 wt % Zn, 5 wt % Mg, and 1 wt % Zr (denoted Al—9Zn—5Mg—1Zr).

In at least one aspect, alloys of the present disclosure are magnetron sputtered onto steel substrates to form coatings disposed on the steel substrates. In at least one aspect, the thickness of an aluminum alloy coating of the present disclosure is from 0.1 µm to about 100 µm, such as from 0.1 µm to about 70 µm, such as from about 1 µm to about 50 µm, such as from about 2 µm to about 30 µm, such as from about 0.1 µm to about 5 µm.

Magnetron Sputtering

In at least one aspect, a corrosion resistant aluminum alloy coating is formed on a steel substrate using magnetron sputtering. Magnetron sputtering is ideal for depositing coatings as described herein because magnetron sputtering does not require ionization of a target and the alloy of the target deposits onto a substrate. Magnetron sputtering involves removal of a material from a target and the removed material is then deposited onto a substrate. Targets used for magnetron sputtering of the present disclosure include aluminum alloys of the present disclosure. The aluminum alloy targets can be formed by conventional melting and casting methods. For example, if an aluminum-zinc-magnesium-zirconium alloy is desired, calculated amounts of each of the pure metals are melted together in a resistance-heating furnace using graphite crucibles to form the alloy. Ingots of the alloy are cast and machined in the form of cylindrical bars. From the cylindrical bars, targets for subsequent magnetron sputtering are machined using electrical discharge machining. In at least one aspect, cylindrical bars are cut into 3" or 2" diameter discs with thickness of 3 mm for use as targets.

Any suitable magnetron sputtering system can be used to deposit aluminum alloys of the present disclosure onto a substrate, such as a multitarget magnetron sputtering system from Hind High Vac Pvt. Ltd, Bengaluru, India. The magnetron sputtering system includes one or more targets. In at least one aspect, the surface area of a target is from about 1,000 cm$^2$ to about 2,000 cm$^2$. Alternatively, the surface area of a target is from about 50 cm$^2$ to about 500 cm$^2$. In at least one aspect, a substrate is disposed on a rotating table within the chamber. In at least one aspect, a substrate is rotated during magnetron sputtering at a rate from about 10 revolutions per minute (rpm) to about 400 rpm during depositions of an aluminum alloy, such as from about 20 rpm to about 200 rpm.

In at least one aspect, a bias is applied to the substrate at different phases of a deposition process. For example, a bias is provided to a bias electrode (or chuck electrode) in a rotatable substrate table from a source (e.g., DC and/or RF source), so that the substrate is bombarded with ions formed in the plasma during one or more phases of the deposition process. In at least one aspect, the bias is applied to the substrate after the aluminum alloy deposition process has been performed. Alternately, the bias is applied during the aluminum alloy deposition process. A larger negative substrate bias will tend to drive the positive ions generated in the plasma towards the substrate or vice versa, so that they have a larger amount of energy when they strike the substrate surface.

In at least one aspect, a pulsed DC power source is configured to deliver power impulses with voltages, such as between about 1 megavolts (MV) and about 8 MV over short durations, between about 10 µs and about 200 µs. Typical power sources can deliver power impulses at high voltages over short durations to generate a high density and energy plasma during a pulsed DC process. Voltages can be from about 100 V to about 12,000 V. For aluminum alloy targets, however, negative voltage pulses having a voltage from about 200 V to about 1,000 V can be sufficient, such as from about 500 V to about 1,000 V to the target relative to the anode (e.g., the vacuum chamber walls). A power impulse (or energy pulse) can be generated by a power source with a time duration (or pulse width) and a pulse cycle time. In one aspect, the time duration of each power impulse is between about 10 µs and about 40 µs and a pulse cycle time of about 200 µs, which corresponds to a pulse repetition frequency of 5000 Hz, i.e. an interval between sequential pulses of 160-190 µs. The power or energy delivered over the pulse cycle time may have a non-square wave shape during a time duration, and thus the average power over the time duration may be at a value between about 2 kilo-Watts (kW) and about 40 kW, such as between about 2 kW and 40 kW. In at least one aspect, each power impulse provided to the target has equal amounts of power and/or equal durations. Alternatively, each pulse provided to the target has a different amount of power and/or a different duration.

To achieve the high amount of reactive energy and the high degree of ionization of the sputtered material during an HIPIMS process, various processing parameters can be controlled to promote the generated sputter material to have low porosity and low hydrogen embrittlement. In some aspects, the process parameters include the control of the magnetic field strength of the magnetron positioned adjacent a target and the amount of power delivered in a power impulse over a time duration to generate a plasma that has a desirable energy and plasma density.

Higher plasma densities will increase the HIPIMS deposition rate and ionization rate of the sputtered atoms that pass through the plasma. Furthermore, the peak in the plasma density shifts towards shorter pulse widths as the bias voltage increases, thus the peak plasma density is a function of target bias voltage and pulse width. In one example, a 500 V target bias applied during a power impulse has a current of 2 A and pulse frequency of 70 KHz.

After cleaning the steel substrates with one or more cleaning procedures, the substrates are mounted on supports operable to rotate during deposition. Cleaning procedures include sand blasting the substrate surface with alumina grits followed by removing the dust particles by blowing with air and argon. Before deposition, target surfaces may also be cleaned. Typical target cleaning includes ultrasonic surface cleaning with acetone. In at least one aspect, the substrates are cleaned using Argon ion plasma by reversing the polarity of substrates or applying additional voltage. During deposition of an aluminum alloy, the closest distance between a portion of a target and a portion of the steel substrate is from about 3 cm to about 20 cm, such as from about 6 cm to about 10 cm.

Figure 2:
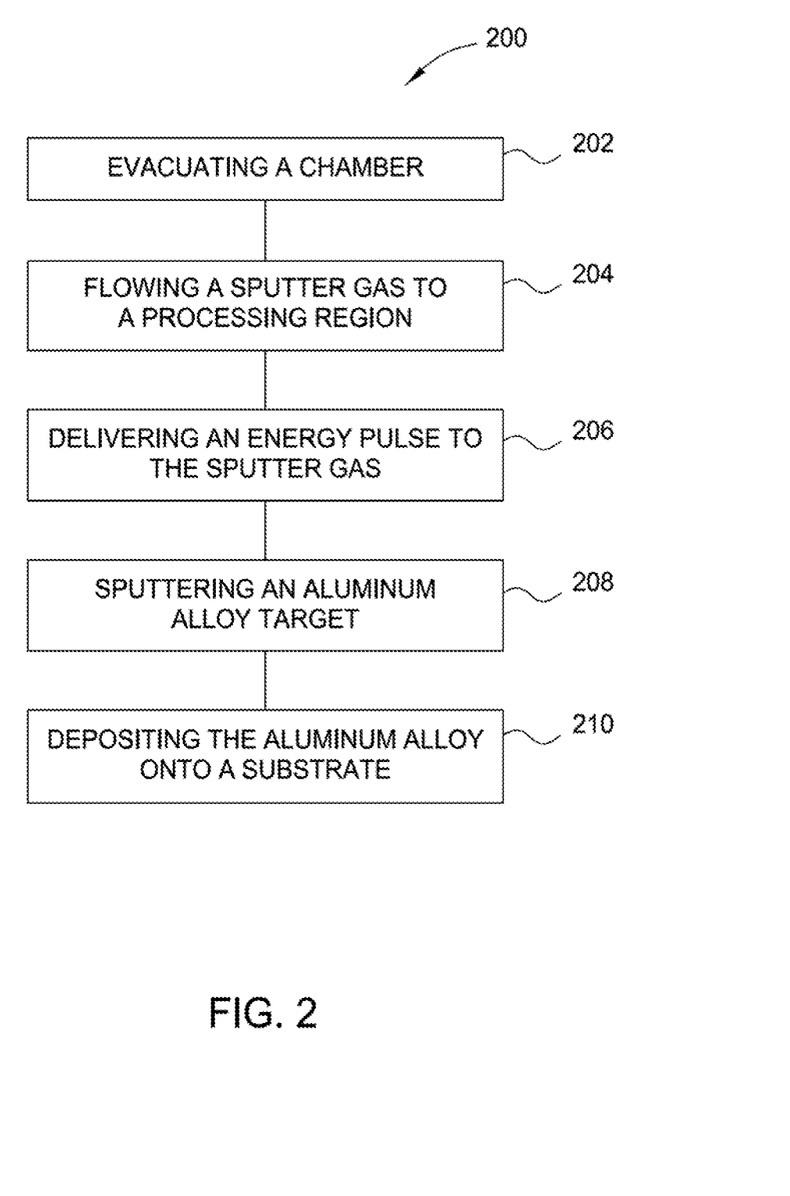
FIG. 2 is a flow diagram of a method for depositing an aluminum alloy coating on a steel substrate in a magnetron sputtering chamber according to an aspect of the present disclosure.

FIG. 2 is a flow diagram of a method for depositing an aluminum alloy coating on a steel substrate in a magnetron sputtering chamber. As shown in FIG. 2, method 200 includes evacuating 202 a chamber, such as vacuum deposition device 200, with a high vacuum pump to a pressure below $5 \times 10^{-4}$ Torr, such as below $5 \times 10^{-6}$ Torr, after introducing a substrate into a chamber and, optionally, cleaning the substrate. In at least one aspect, before the deposition, the steel substrate is heated to a temperature from about 300° C. to about 900° C., such as about 450° C. to about 700° C., such as about 570° C. to about 630° C.

Method 200 includes flowing 204 a sputter gas to a processing region of a process chamber, the process chamber having an aluminum alloy sputter target. Method 200 includes delivering 206 an energy pulse to the sputter gas to create a sputtering plasma. The sputter gas is generally a gas which is inert to the substrate or the sputter target. In one example, the sputtering gas is argon. A constant argon flow is used, rendering a chamber pressure of about 15 mTorr or lower, such as from about 1 mTorr to about 10 mTorr, such as from about 3 mTorr to about 8 mTorr. The deposition is initiated preferably in pure argon sputtering gas. The gas is introduced at a constant flow, which is maintained during the deposition. The sputtering plasma is formed in the processing volume that is adjacent to the aluminum alloy sputter target to form a sputtered aluminum alloy material. In one aspect, the sputtering plasma has a sputtering duration, and the energy pulse has an average power between 2 W/cm² and 12 W/cm². The sputtering plasma is controlled by a magnetic field, the magnetic field being less than 900 Gauss.

In general, providing the energy pulses includes the selection of a target bias voltage and pulse width that form a plasma that will impart a desirable amount of energy to provide a desirable plasma energy to provide a high ionization rate and degree of ionization to the sputtered atoms, which provides a desirable sputter deposition rate. In one aspect, the energy pulses used to form the sputtering plasma each have an average power between about 1 W/cm² and about 10 W/cm². The magnetron's magnetic field may be less than about 300 Gauss, such as about 200 Gauss. In at least one aspect, a substrate is 6 inches by 6 inches, and an overall power of a sputtering process is about 1 kW. In at least one aspect, a larger substrates is used, such as a substrate having a top surface area of 15 m². Suitable large area coaters can be obtained, for example, by Hind High Vac Pvt. Ltd, Bengaluru, India. Method 200 includes sputtering 208 an aluminum alloy target to form a sputtered aluminum alloy and depositing 210 the aluminum alloy onto a substrate, such as a steel substrate.

In another aspect, the magnetron sputtering method described above may be used to form one or more intermediate layers. Once the intermediate layers are formed, the aluminum alloy material is deposited onto the steel substrate containing one or more intermediate layers. In at least one aspect, an intermediate layer includes a second layer having a metal oxide, nitride, carbide, and metal-oxynitride.

Examples

A Multitarget Magnetron Sputtering system from Hind High Vac Pvt. Ltd, Bengaluru, India was used for depositing the coatings. The sputtering system has the capability to deposit on flat substrates with rotation and a vacuum amenable rotating device for coating on steel substrates.

For the fabrication of aluminum and aluminum-alloy targets for magnetron sputtering, electrolytic grade aluminum ingot (99.9%), electrolytic grade Zn (99.9%), >99%, pure Mg, and 99% pure Zr rod has been used. The Al-alloys are made by melting and casting methods. A predetermined amount of pure metals is taken and melted in a resistance-heating furnace using graphite crucibles. The ingots cast are machined in the form of cylindrical bars from which targets are machined using electrical discharge machining. The following alloy targets were made by this process:
i) Al—5Mg (5% Mg by wt. and balance is Al)
ii) Al—5Zn—5Mg (5% Zn, 5% Mg by wt. and balance is Al)
iii) Al—9Zn—5Mg (9% Zn, 5% Mg by wt. and balance is Al)
iv) Al—9Zn—5Mg—1Zr (9% Zn, 5% Mg, 1% Zr by wt. and balance is Al)

The cylindrical bars were cut into the form of 3" and 2" diameter discs with thickness of 3 mm for use as targets. The target was mounted on a water-cooled cathode of the chamber. The surfaces of aluminum alloy targets were ultrasonically cleaned with acetone and sputtered for 1 hour prior deposition on the substrates.

The substrates (4130 high strength steel) were sand blasted with alumina grits and after removing the dust particles by blowing with air and argon were placed on the base plate attached with a shutter (to avoid any contamination during pre-sputtering of targets).

The vacuum chamber was pumped down to $1-2 \times 10^{-6}$ mbar using a turbo pump attached with the system. Aluminum or aluminum alloys were sputter deposited on the substrates after sputter cleaning the target. The substrate sizes were varied from 1 inch×3 inch to 3 inch×3 inch. The coating thicknesses of the aluminum or aluminum alloy coatings depended upon the deposition times and deposition power. The typical deposition rate was calculated to be 2-3 micrometers per hour at the power of 300 Watts (DC).

For the deposition of aluminum alloy onto flat steel substrates, the deposition parameters, e.g. DC power, rate of argon flow into the chamber, deposition pressure (4-6×10$^{-3}$ mbar), and target to substrate distance (10 cm) were kept constant to form each of the coatings onto their respective steel substrates. Four substrates were coated in the present chamber simultaneously. The flat substrates were rotated at 20 RPM during deposition. To deposit alloys onto the 4340 high strength steel, the samples were rotated inside the deposition chamber at 200 RPM. The distance between target and substrate was 6 cm and all other parameters were kept constant. During the sputtering processes, the presence of oxygen in the deposition chamber was minimized by evacuation of the chamber to obtain sufficiently bright coatings.

All of the coated samples are receptive to conversion coatings such as chromate coatings (e.g., ALODINE 1200). The passivated samples were tested for corrosion protection by Open Circuit Potential measurements and in a salt spray chamber (according to ASTM B 117).

Porosity

The porosities of the samples were measured using a Mercury porosimeter (AMP-60-K-A-1, PMI, USA). The porosities were measured with maximum Mercury Injection pressure of 30,000 to 60,000 PSI. The coated samples are evacuated to a vacuum level of ~10$^{-2}$ mbar and then mercury is introduced into the pores by applying hydraulic pressures. The amount of mercury injected within the pores is measured to obtain the porosities on the coatings. It is assumed that the solid metal substrates do not have any pores on the surface, where the deposition has been made.

Figure 3:
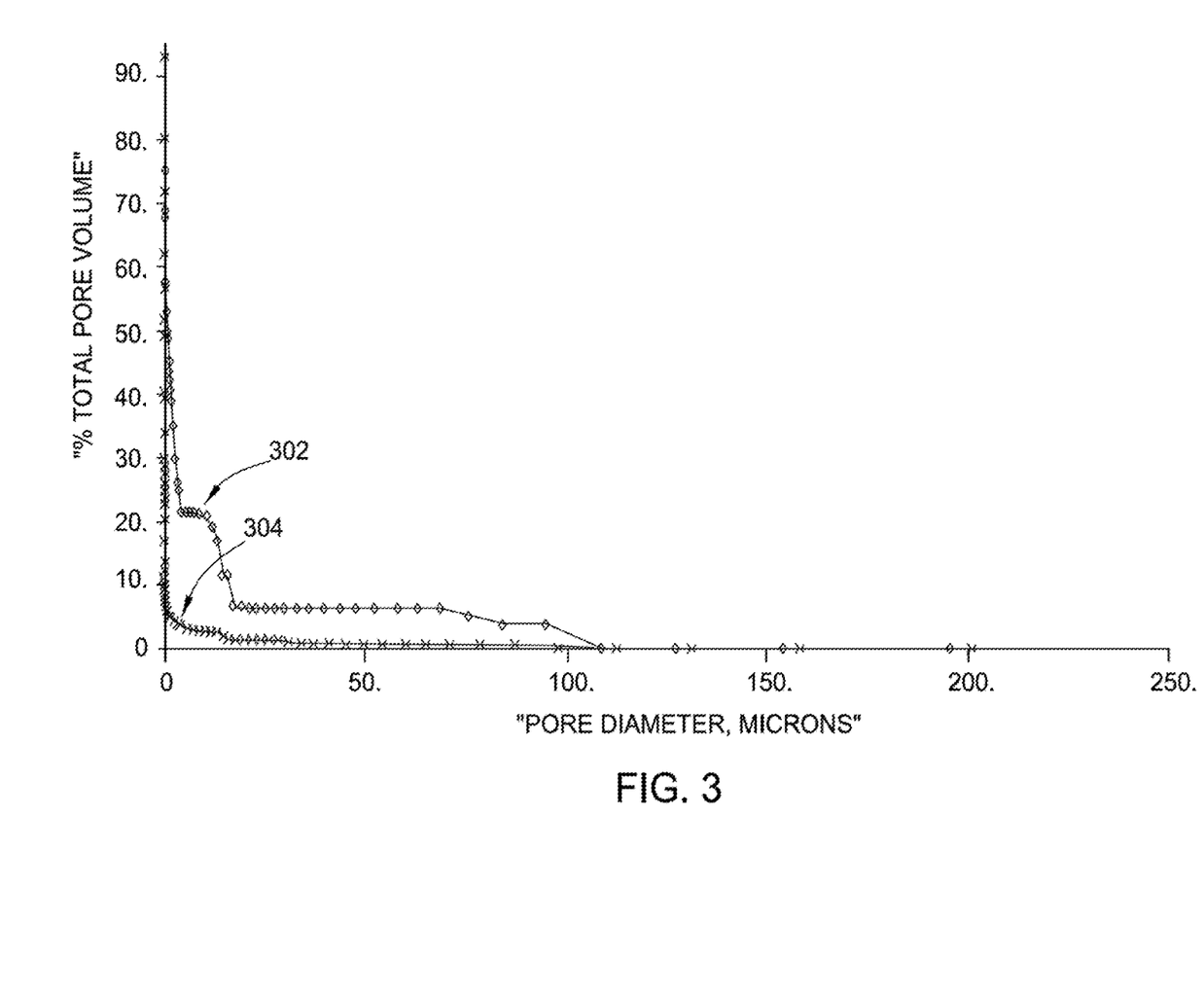
FIG. 3 is a graph illustrating percent total pore volume versus pore diameter for aluminum coatings deposited onto a steel substrate using ion vapor deposition or magnetron sputtering.

In at least one aspect, aluminum alloy coatings of the present disclosure have a percent total pore volume of about 5% or less and an average pore diameter about 10 microns or less. For example, aluminum alloy coatings can have a percent total pore volume from about 0.1% to about 5%, such as from about 1% to about 3%, and an average pore diameter from about 1 micron to about 10 microns, such as from about 3 microns to about 7 microns. FIG. 3 is a graph illustrating percent total pore volume versus pore diameter for aluminum coatings deposited onto a steel substrate using ion vapor deposition or magnetron sputtering. As shown in FIG. 3, aluminum coatings (and aluminum alloy coatings of the present disclosure) deposited using ion vapor deposition have ~20% of the total pore volume are due to the presence of pores larger than 5 micrometer diameter (line 302). In comparison, aluminum coatings (and aluminum alloy coatings of the present disclosure) deposited using magnetron sputtering as described above have only 5% of the total pore volume due to the pores with diameters larger than 5 microns (line 304).

Figure 4A:
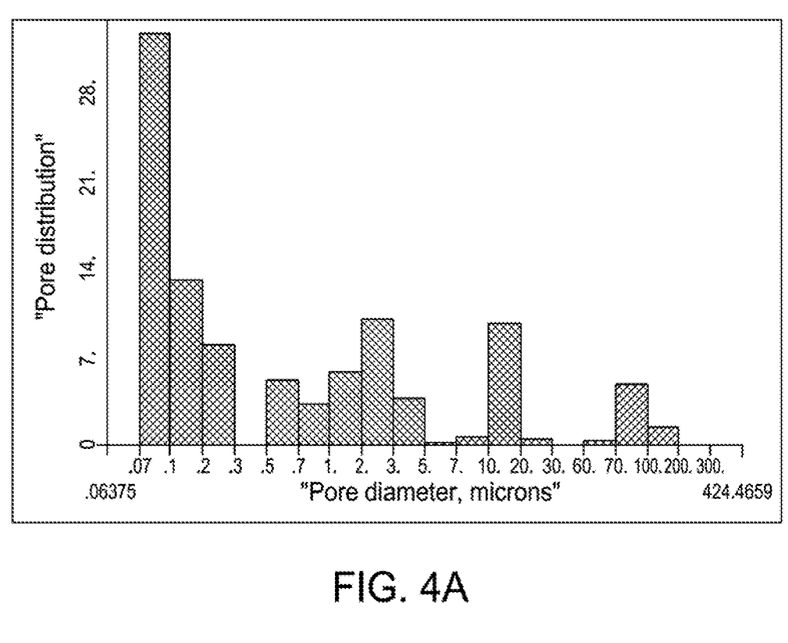
FIG. 4A is a bar graph illustrating pore distribution versus pore diameter for aluminum coating deposited onto a steel substrate using ion vapor deposition.
Figure 4B:
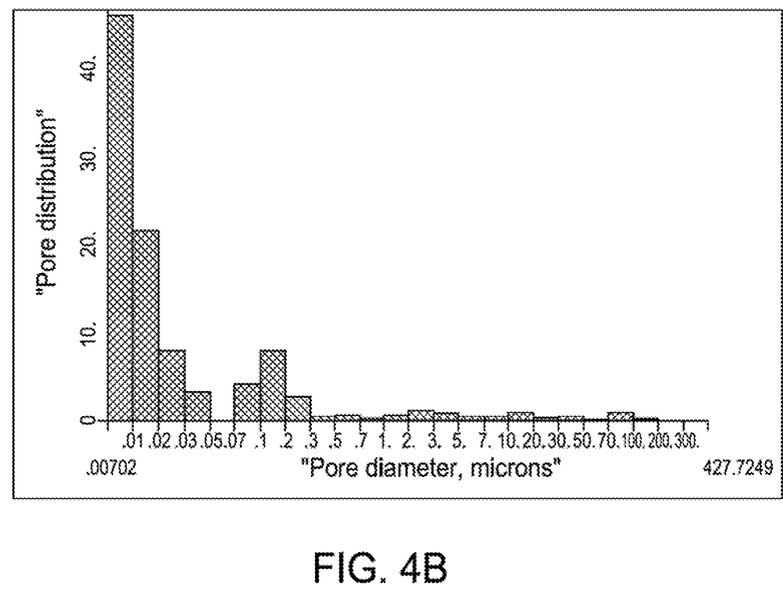
FIG. 4B is a bar graph illustrating pore distribution versus pore diameter for aluminum coating deposited onto a steel substrate using magnetron sputtering according to an aspect of the present disclosure.

FIGS. 4A and 4B are bar graphs illustrating pore distribution versus pore diameter for aluminum coating deposited onto a steel substrate using ion vapor deposition or magnetron sputtering. As shown in FIG. 4A, 40% or more of the total pores of an aluminum coating (deposited by a conventional ion vapor deposition process) have a pore diameter greater than 0.5 microns. In contrast, as shown in FIG. 4B, 10% or less of the total pores of an aluminum coating (deposited by magnetron sputtering, as described above) have a pore diameter greater than 0.5 microns.

Salt Spray Testing (ASTM B 117)

It was discovered that after 500 hours of salt spray exposure, sputter deposited Al—5Mg coatings on steel substrates have no red rust formation (observable to the human eye). Similarly, sputter deposited Al—9Zn—5Mg coatings on steel substrates have no red rust formation after 500 hours of salt spray testing. However, small specks of red rust were observed on sputter deposited Al—9Zn—5Mg coatings after 1,000 hours of salt spray testing. Ion vapour deposition is limited to pure Al coatings. Moreover, IVD with multiple elements is very difficult. So, magnetron sputtering provides for easy manipulation of alloy compositions. The current practice in the aerospace industry is to use pure Al coatings by IVD, but they do not provide sacrificial protection in pure water. Hence, magnetron sputtering and Al alloy deposition provide an advantage over conventional methods and corrosion resistant materials. Moreover, Al alloys provide better corrosion resistance than pure Al.

For sputter deposited Al—9Zn—5Mg—1Zr coatings on steel substrates, no red rust formation is observed after 500 hours of salt spray testing or even after 1,000 hours. Alloys with Zn content less than 9% may sustain for less number of salt spray hours. Similarly, alloys with Zn content greater than or equal to 10% can increase hydrogen embrittlement because of its reactivity with chloride in aqueous medium. These corrosion resistant alloy coatings are on the same order of corrosion resistance as Zn—Ni platings, which have corrosion resistance according to ASTM B 117 of 500 hours or more.

Humidity Testing

Steel substrates having sputter deposited alloys of the present disclosure were also subjected to a humidity test. For the humidity test, a scribed test panel is exposed to 95% minimum relative humidity at 100° F. to 115° F. (38 to 46° C.) for 500 hours.

Sputter deposited 100% aluminum coated steel substrates have no observable red rust formation after 500 hours of humidity testing. Similarly, sputter deposited Al—5Mg coated steel substrates have no red rust formation after 500 hours of humidity testing. Similarly, sputter deposited Al—9Zn—5Mg—1Zr coated steel substrates have no red rust formation after 500 hours of humidity testing.

Open Circuit Potential

Open circuit potential was used as a quantitative criterion for the corrosion protection ability of aluminum alloy coatings of the present disclosure disposed on steel substrates. The open circuit potential of a coating should be negative to steel, which indicates that the coating provides sacrificial protection to the steel. The open circuit potential is a parameter which indicates the thermodynamic tendency of a material to electrochemical oxidation in a corrosive medium. The open circuit potential of these aluminum alloy coatings were measured in distilled water and 3.5% NaCl solution for 14 days as per ASTM G 82. Electrochemical cells were made with the coated surface as the working electrode and a Calomel electrode was used as reference electrode. The temperature during an open circuit potential measurement was maintained at about 30° C.

From the comparative studies on the aluminum coated steel substrates formed by magnetron sputtering versus conventional ion vapor deposition, it was observed:

i) The open circuit potential of pure aluminum coatings are negative to 4130 steel substrates in 3.5% NaCl solution, and ii) The open circuit potential of sputter deposited aluminum and ion vapor deposited aluminum coatings are positive to 4130 substrates in distilled water, which indicates that aluminum coatings will not be sacrificial to the steel substrates.

Therefore, sputter deposited aluminum alloy coatings of the present disclosure can be used to overcome the open circuit potential limitations of 100% Al coatings in distilled water and also with improved corrosion resistances.

100% aluminum, manganese(Mn)-containing aluminum alloy, magnesium(Mg)-containing aluminum alloys, and Mg-Silicon(Si)-containing alloys have excellent corrosion resistance in water. The addition of copper (Cu) to any of the aluminum alloys increases the rate of corrosion. The addition of Mg to the aluminum alloys increases the corrosion resistance of aluminum alloys in sea water. Furthermore, Al—Mg alloys have better corrosion resistance than Al—Mg—Si alloys in sea water. At room temperature, the Mg has 2% solid solubility in Al-alloys and above 5% Mg content, an aluminum alloy becomes susceptible to stress corrosion. Therefore, it was decided to investigate a maximum of 5% Mg content of the Al alloys.

High zinc content improves corrosion resistance of Al alloys. Furthermore, the addition of Mg to Al—Zn alloys improves the corrosion resistance further. Al—Zn—Mg coatings provide better corrosion resistance than Al—Zn coatings. Furthermore, the improvement of mechanical properties and stress corrosion resistance of Al—Zn—Mg alloys can be achieved by inclusion of Zr in an alloy.

Figure 5:
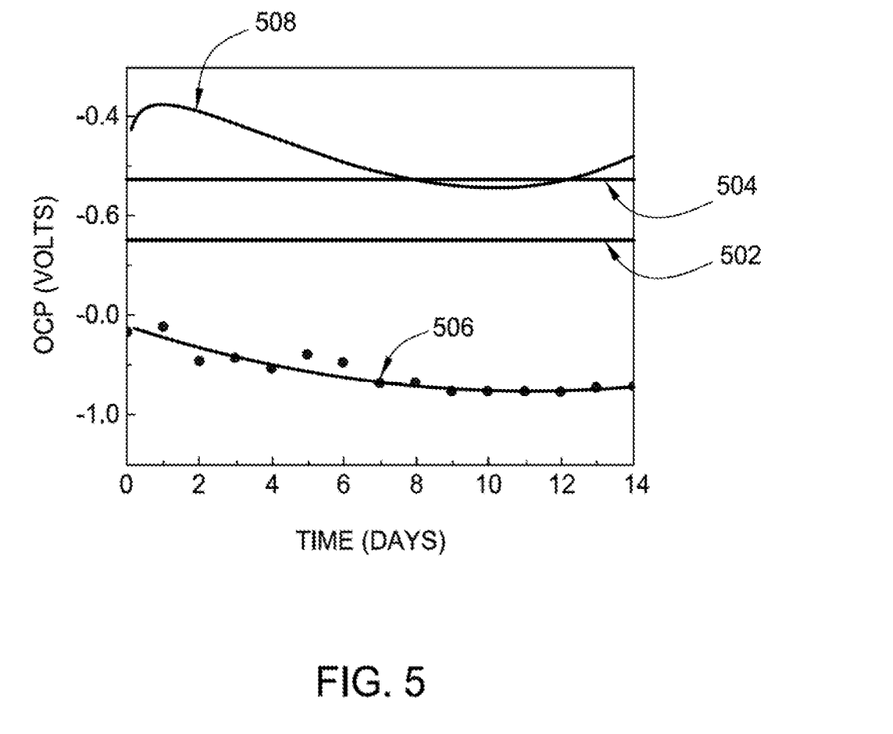
FIG. 5 is a graph illustrating the open circuit potential of Al—5Mg alloys in both distilled water and in 3.5% NaCl solution according to an aspect of the present disclosure.
Figure 7:
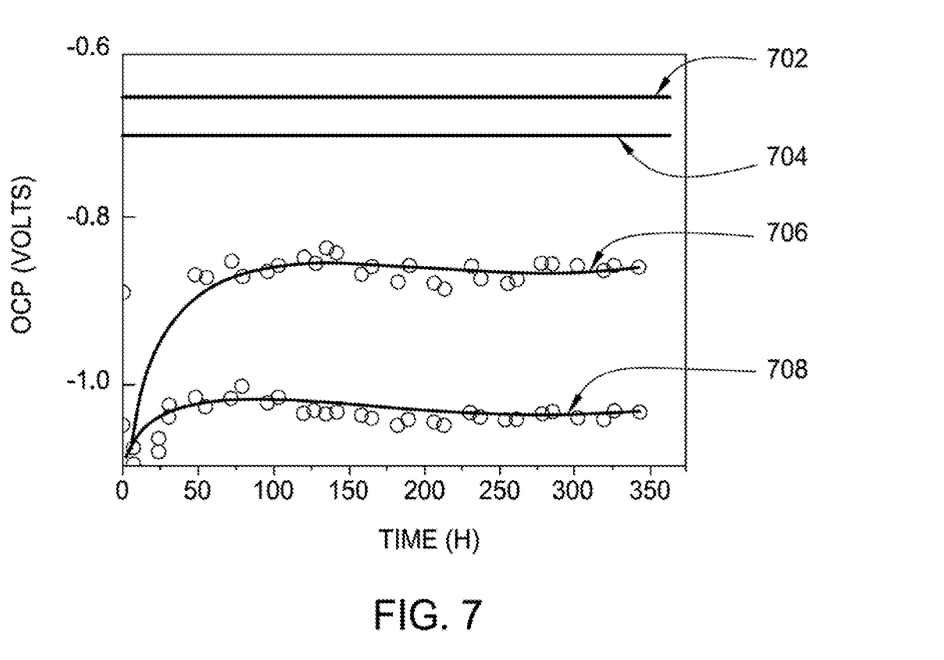
FIG. 7 is a graph illustrating the open circuit potential of Al—9Zn—5Mg alloys in both distilled water and in 3.5% NaCl solution according to an aspect of the present disclosure.

FIG. 5 is a graph illustrating the open circuit potential of Al—5Mg alloys in both distilled water and in 3.5% NaCl solution. As shown in FIG. 7, the straight solid lines represent the rest potential of steel in 3.5% NaCl solution (502) or pure water (504). Rest potential is the open circuit potential when the circuit is open and allowed to equilibrate with the surrounding environment, e.g. salt water or pure water. The curved lines represent open circuit potential values of Al—5Mg coated steel in 3.5% NaCl solution (506) or pure water (508). The more negative open circuit potential values are compared to steel in saline water, the more sacrificial protection to steel these aluminum alloy coatings can provide. In pure water, these coatings are more noble than steel, and hence provide barrier protection.

Figure 6:
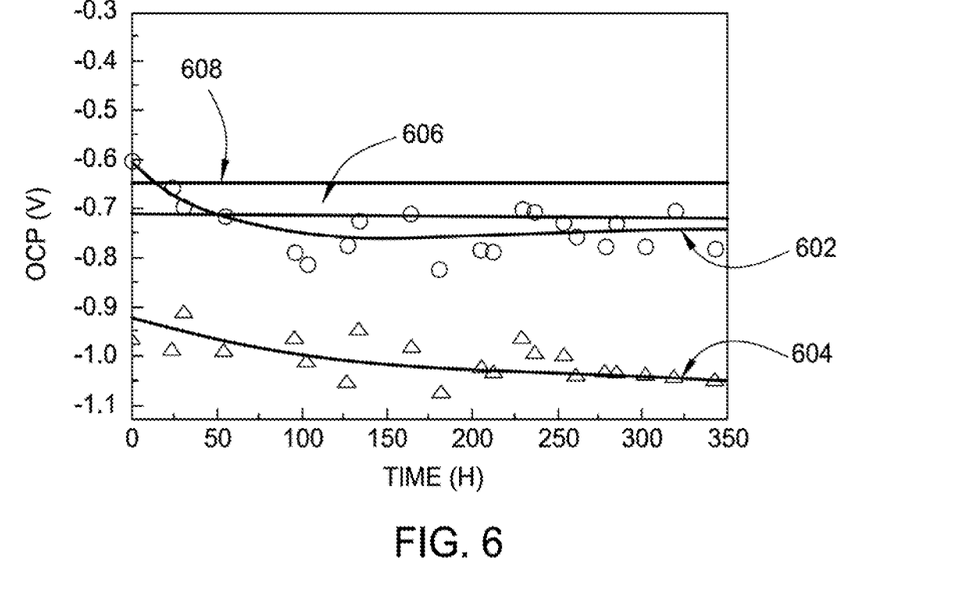
FIG. 6 is a graph illustrating the open circuit potential of Al—5Zn—5Mg alloys in both distilled water and in 3.5% NaCl solution according to an aspect of the present disclosure.

FIG. 6 is a graph illustrating the open circuit potential of Al—5Zn—5Mg alloys in both distilled water and in 3.5% NaCl solution. As shown in FIG. 6, the open circuit potential of the Al—5Zn—5Mg alloys in both media are cathodic to steel (water: line 602; 3.5% NaCl: line 604). The straight solid lines represent the rest potential of steel in 3.5% NaCl solution (606) or pure water (608). Again, the more negative open circuit potential values are compared to steel in saline water, the more sacrificial protection to steel these aluminum alloy coatings can provide.

FIG. 7 is a graph illustrating the open circuit potential of Al—9Zn—5Mg alloys in both distilled water and in 3.5% NaCl solution. As shown in FIG. 7, the Al—9Zn—5Mg alloys provide lower open circuit potential to steel substrates in distilled water as well as in saline media (lines 706 and 708, respectively), as compared to Al—5Zn—5Mg. The straight solid lines represent the rest potential of steel in 3.5% NaCl solution (704) or pure water (702).

Figure 8:
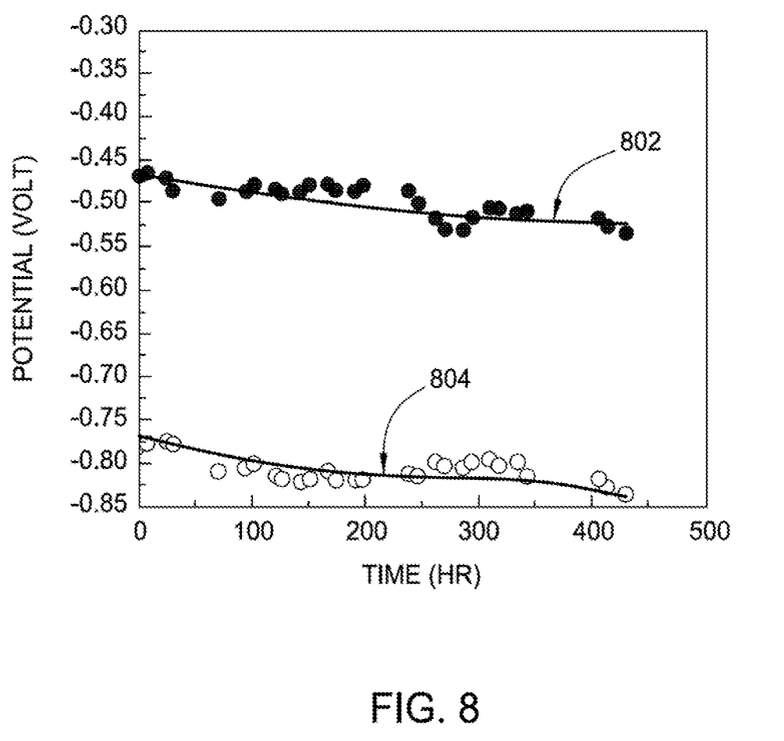
FIG. 8 is a graph illustrating the open circuit potential of Al—9Zn—5Mg—1Zr alloys in both distilled water and in 3.5% NaCl solution according to an aspect of the present disclosure.

FIG. 8 is a graph illustrating the open circuit potential of Al—9Zn—5Mg—1Zr alloys in both distilled water and in 3.5% NaCl solution. As shown in FIG. 8, the curved lines represent open circuit potential values of Al—9Zn—5Mg—1Zr coated substrates in pure water (802) and 3.5% NaCl solution (804). These aluminum alloy coatings provide sacrificial protection to steel. In pure water, these coatings are more noble than steel, and hence provide barrier protection.

Hydrogen Embrittlement

Hydrogen Embrittlement (HE) tests were performed according to ASTM F 519 using Type 1a.1 specimens having a notch. For HE testing, a load is applied to a notch on a High Strength Steel 4340 specimen (Type 1a.1) without any coating to determine an average Notch Fracture Strength (NFS) value based from three uncoated samples. Average NFS for the High Strength Steel 4340 sample was determined to be 3,953 Kg for 200 hours. No failure was observed under ASTM F 519.

Alloys, as described above, were sputter deposited onto new High Strength Steel 4340 specimens (Type 1a.1). Then, 75% load of the average NFS value (75% of 3,953 Kg=2,964.75 Kg, about 2,965 Kg) was applied to the samples and held at this load for 200 hours. No fracturing was observed, indicating that the coatings pass the HE test. It was observed that alloy coatings deposited onto High Strength Steel 4340 specimens using a conventional ion vapor deposition process also pass the test, but, as described above, the ion vapor deposition samples do not pass the corrosion tests, especially the OCP tests. Moreover, the IVD coatings involve an additional step of shot peening to reduce the porosity to pass the corrosion tests, i.e. salt spray.

Overall, aluminum alloys of the present disclosure can be disposed on a substrate, such as a steel substrate, such as an aircraft component. Aluminum alloys of the present disclosure provide reduced porosity as compared to coatings formed by ion vapor deposition. In addition, aluminum alloys of the present disclosure allow for a broader range of metals to be used in corrosion resistant coatings, as compared to Zn—Ni plating, which cannot form coatings having more than two different metals. Aluminum alloys of the present disclosure provide coatings having the same or greater corrosion resistance as Zn—Ni platings, which have corrosion resistance according to ASTM B 117 of 500 hours or more. Alloys of the present disclosure can be formed without the use of organic solvents and other unfavorable materials.

The descriptions of the various aspects of the present disclosure have been presented for purposes of illustration, but are not intended to be exhaustive or limited to the aspects disclosed. Many modifications and variations will be apparent to those of ordinary skill in the art without departing from the scope and spirit of the described aspects. The terminology used herein was chosen to best explain the principles of the aspects, the practical application or technical improvement over technologies found in the marketplace, or to enable others of ordinary skill in the art to understand the aspects disclosed herein. While the foregoing is directed to aspects of the present disclosure, other and further aspects of the present disclosure may be devised without departing from the basic scope thereof.

What is claimed is:

1. An alloy coating for coating a substrate, comprising:
   aluminum; and
   one or more of:
      about 1 wt % to about 15 wt % zinc based on the total weight of the alloy,
      about 1 wt % to about 10 wt % magnesium based on the total weight of the alloy, and
      about 0.1 wt % to about 5 wt % zirconium based on the total weight of the alloy,
   the alloy coating having a percent total pore volume of about 5% or less and an average pore diameter about 10 microns or less.

2. The alloy coating of claim 1, wherein the alloy coating comprises zinc from about 5 wt % to about 12 wt %.

3. The alloy coating of claim 1, wherein the alloy coating comprises magnesium from about 1 wt % to about 5 wt % based on the total weight of the alloy.

4. The alloy coating of claim 3, wherein the alloy coating comprises about 5 wt % magnesium based on the total weight of the alloy.

5. The alloy coating of claim 4, wherein the alloy coating comprises about 9 wt % zinc based on the total weight of the alloy.

6. The alloy coating of claim 5, wherein the alloy coating comprises about 1 wt % Zr based on the total weight of the alloy.

7. The alloy coating of claim 1, wherein the alloy coating is:
   an alloy comprising 5 wt % Mg and 95 wt % Al,
   an alloy comprising 5 wt % Zn, 5 wt % Mg, and 90 wt % Al,
   an alloy comprising 9 wt % Zn, 5 wt % Mg, and 86 wt % Al, or
   an alloy comprising 9 wt % Zn, 5 wt % Mg, 1 wt % Zr and 85 wt % Al.

8. The alloy coating of claim 7, wherein the alloy coating comprises 9 wt % Zn, 5 wt % Mg, 1 wt % Zr and 85 wt % Al.

9. The alloy coating of claim 1, wherein 10% or less of the total pores of the alloy coating have a pore diameter greater than 0.5 microns.

10. A substrate comprising a coating according to claim 1 disposed thereon, wherein the substrate comprises steel.

11. The substrate of claim 10, wherein the alloy coating has a thickness from about 1 μm to about 50 μm.

12. The substrate of claim 11, wherein the alloy coating has a thickness from about 2 μm to about 30 μm.

13. The substrate of claim 10, wherein the alloy coating has an open circuit potential that is less than an aluminum coating of the same porosity in both distilled water and 3.5% sodium chloride solution according to ASTM G 82 at 30° C.

14. The substrate of claim 10, wherein the alloy coating does not fracture at about 2,965 Kg load for 200 hours according to ASTM F 519.

15. The substrate of claim 10, further comprising a layer disposed between the steel substrate and the alloy coating, the second layer comprising a metal oxide, nitride, carbide, or metal-oxynitride.

16. A substrate comprising:
   an alloy coating disposed on the substrate, wherein the alloy coating comprising:
      aluminum; and
      one or more of:
         about 1 wt % to about 15 wt % zinc based on the total weight of the alloy,
         about 1 wt % to about 10 wt % magnesium based on the total weight of the alloy, and
         about 0.1 wt % to about 5 wt % zirconium based on the total weight of the alloy,
   the alloy coating having a percent total pore volume of about 5% or less and an average pore diameter about 10 microns or less.

17. The substrate of claim 16, wherein the alloy coating comprises zinc from about 5 wt % to about 12 wt %.

18. The substrate of claim 16, wherein the alloy coating comprises magnesium from about 1 wt % to about 5 wt % based on the total weight of the alloy.

19. The substrate of claim 18, wherein the alloy coating comprises about 5 wt % magnesium based on the total weight of the alloy.

20. The substrate of claim 19, wherein the alloy coating comprises about 9 wt % zinc based on the total weight of the alloy.

21. The substrate of claim 20, wherein the alloy coating comprises about 1 wt % Zr based on the total weight of the alloy.

22. The substrate of claim 16, wherein 10% or less of the total pores of the alloy coating have a pore diameter greater than 0.5 microns.

23. The substrate of claim 16, wherein the alloy coating is disposed directly on the substrate.

\* \* \* \* \*